(12) United States Patent
Stamate

(10) Patent No.: US 9,318,297 B2
(45) Date of Patent: Apr. 19, 2016

(54) ION BEAM EXTRACTION BY DISCRETE ION FOCUSING

(75) Inventor: Eugen Stamate, Roskilde (DK)

(73) Assignee: DANMARKS TEKNISKE UNIVERSITET, Kgs. Lyngby (DK)

( * ) Notice: Subject to any disclaimer, the term of this patent is extended or adjusted under 35 U.S.C. 154(b) by 374 days.

(21) Appl. No.: 13/123,692

(22) PCT Filed: Oct. 8, 2009

(86) PCT No.: PCT/EP2009/063101
§ 371 (c)(1),
(2), (4) Date: May 24, 2011

(87) PCT Pub. No.: WO2010/040805
PCT Pub. Date: Apr. 15, 2010

(65) Prior Publication Data
US 2011/0266957 A1   Nov. 3, 2011

Related U.S. Application Data

(60) Provisional application No. 61/195,837, filed on Oct. 9, 2008.

(30) Foreign Application Priority Data

Oct. 9, 2008  (EP) .................................... 08017709

(51) Int. Cl.
*H01J 27/02*   (2006.01)
*H01J 37/08*   (2006.01)

(52) U.S. Cl.
CPC ............... *H01J 27/024* (2013.01); *H01J 37/08* (2013.01); *H01J 2237/083* (2013.01)

(58) Field of Classification Search
CPC ..................................................... H01J 27/02

USPC ........ 315/111.81, 111.18; 250/281, 282, 294, 250/370.01, 374, 492.1, 492.3
See application file for complete search history.

(56) References Cited

U.S. PATENT DOCUMENTS 3,344,299 A *   9/1967   Bounden ....................... 376/116
3,955,091 A *   5/1976   Robinson et al. ......... 250/423 R
(Continued)

FOREIGN PATENT DOCUMENTS

| EP | 1 921 657 A2 | 5/2008 |
| GB | 981 297 | 1/1965 |
| GB | 1 348 562 | 3/1974 |

OTHER PUBLICATIONS

Hine, K., Yoshimura, S., Ikuse, K., Kiuchi, M., & Hamaguchi, S. (Mar. 2008). Measurement of Au sputtering yields by Ar and He ions with a low-energy mass selected ion beam system. In Journal of Physics: Conference Series (vol. 106, No. 1, p. 012019). IOP Publishing.*

*Primary Examiner* — Alexander H Taningco
*Assistant Examiner* — David Lotter
(74) *Attorney, Agent, or Firm* — Lee & Morse, P.C.

(57) ABSTRACT

An apparatus and methods are disclosed for ion beam extraction. In an implementation, the apparatus includes a plasma source (or plasma) and an ion extractor. The plasma source is adapted to generate ions and the ion extractor is immersed in the plasma source to extract a fraction of the generated ions. The ion extractor is surrounded by a space charge formed at least in part by the extracted ions. The ion extractor includes a biased electrode forming an interface with an insulator. The interface is customized to form a strongly curved potential distribution in the space-charge surrounding the ion extractor. The strongly curved potential distribution focuses the extracted ions towards an opening on a surface of the biased electrode thereby resulting in anion beam.

23 Claims, 11 Drawing Sheets

(56) References Cited

U.S. PATENT DOCUMENTS

| | | | |
|---|---|---|---|
| 5,825,035 A * | 10/1998 | Mizumura et al. | 250/423 R |
| 5,954,887 A | 9/1999 | Hatano | |
| 6,647,993 B2 | 11/2003 | Shang et al. | |
| 6,730,197 B2 | 5/2004 | Wang et al. | |
| 6,803,590 B2 | 10/2004 | Brailove et al. | |
| 7,767,977 B1 | 8/2010 | Godet et al. | |
| 2004/0221815 A1 * | 11/2004 | Fukuda et al. | 118/723.001 |
| 2004/0251424 A1 | 12/2004 | Murata et al. | |
| 2006/0253510 A1 * | 11/2006 | Kameyama et al. | 708/200 |
| 2008/0179546 A1 * | 7/2008 | Lee et al. | 250/492.21 |
| 2009/0061605 A1 | 3/2009 | Godet et al. | |
| 2009/0084987 A1 | 4/2009 | Godet et al. | |

\* cited by examiner

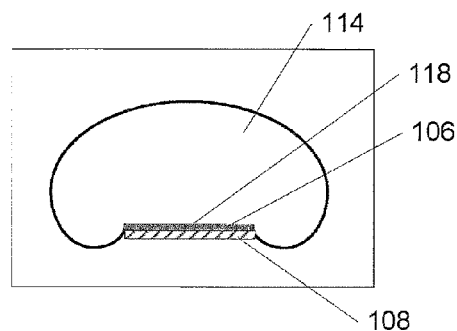
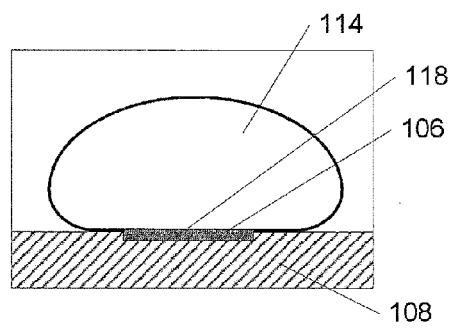
Fig. 4a                     Fig. 4b
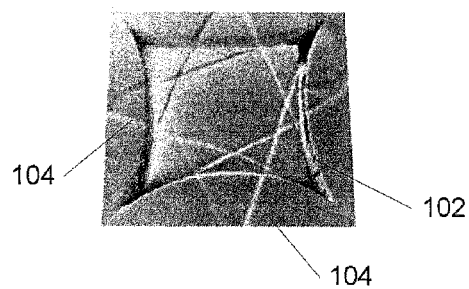
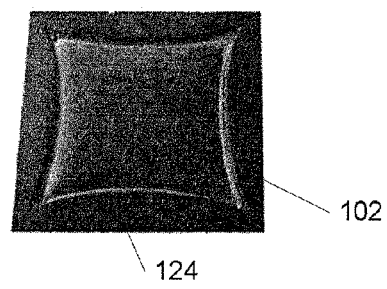
Fig. 4c                     Fig. 4d

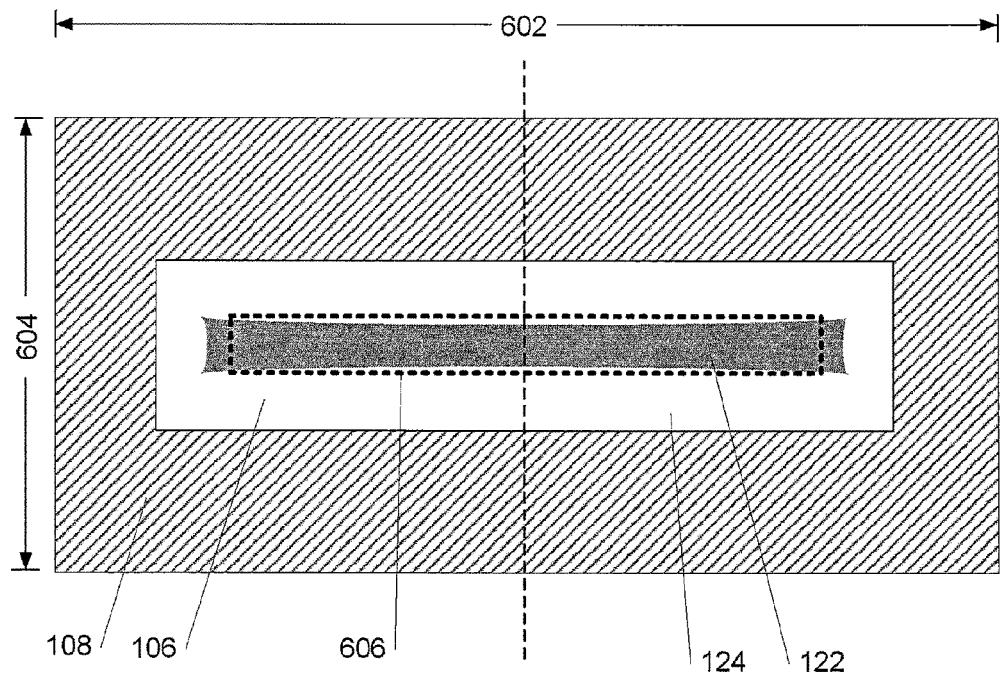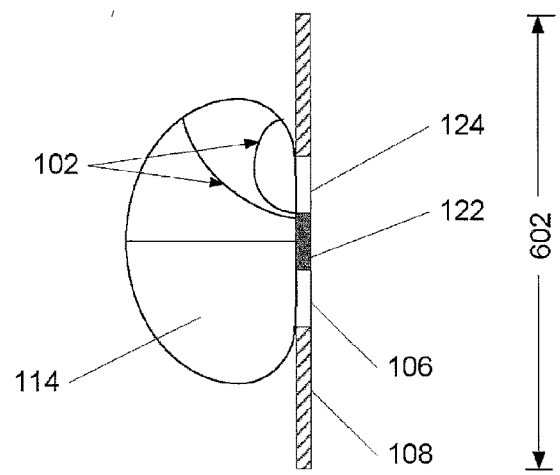
Fig. 6

ION BEAM EXTRACTION BY DISCRETE ION FOCUSING

CROSS REFERENCE TO RELATED APPLICATIONS

This is the U.S. national phase application based on PCT Application No. PCT/EP2009/063101 filed Oct. 8, 2009, which is based on European Application EP 08017709.0, filed Oct. 9, 2008 and U.S. Provisional Application No. 61/195,837 filed Oct. 9, 2008, the entire contents of all of which is hereby incorporated by reference.

FIELD OF THE INVENTION

The present invention relates to an apparatus and a method for positive or negative ion beam extraction from a plasma source by discrete ion focusing.

BACKGROUND

With advancements in material science and engineering, high velocity ion beams have found numerous applications in various fields, such as nanotechnology, metallurgy, etc. In particular, ion beams are used in various techniques, for example surface modification (implantation, etching, ashing, passivation, oxidation), thin film stress relief, oxidizing, nitriding, ion assisted deposition, ion beam insitu precleaning, chemically assisted ion beam etching, reactive ion beam etching, inert ion beam milling and ion beam deposition.

In many applications ions with certain energy are extracted from a plasma source by an extraction mechanism and are subsequently accelerated towards a target for a predefined impact and modification of target characteristics. The extracted ions may also be subjected to additional manipulation and conditioning such as, but not limited to, acceleration of the ions to the desired energy level, deflection, elimination of certain particles from the ion beam necessary for treating the target etc.

Such manipulations and conditioning result in low current density of the ion beam that is steered towards the target. Current density of an ion beam becomes more significant in certain ion implantation applications where a high current density is desired. For instance, in case of high dose (implanted ions) semiconductor manufacturing applications, ion implantation takes place at a faster rate if the ion beam current density is high. As a result of the faster rate of the ion implantation, more semiconductor wafers are manufactured per hour. Therefore, it is desirable to generate ion beams of high current densities.

Ion treatment of large area conductive or non conductive materials, such as three-dimensional mechanical parts for machineries or flat plastics and polymers that may exceed 1 m$^2$, is rather difficult to be performed with conventional ion beam technologies due to the need for long exposure time and/or difficulties in manipulating large area ion beam at low energies (below 1100 eV). Moreover, some materials are heath sensitive so that they cannot be directly immersed in plasma, meaning that a remote treatment with ions extracted from plasma is desired.

Furthermore, a highly focused ion beam is required in techniques such as, but not limited to, very large scale integration processes like nanostructuring, for removing of material on sub 100 nanometer scales, for local deposition of conducting and insulating layers, for high resolution electron imagining, micro-electro-mechanical systems etc. A high current density focused ion beam is also required in material processes, for instance, in milling operations, where materials are required to be reduced from a larger size to a smaller size and/or removed. In such processes, the ion beam is subjected to ion beam current losses during its trajectory towards the target. Thus, in certain applications as above, a high current density ion beam in conjunction with an efficient focusing may be desirable.

Due to simplicity of production and extraction, most technologies are based on surface modification by positive ions. However, treatment of surfaces by energetically negative ions gives the advantage of a reduced surface charging. Negative ion beams of hydrogen are also relevant to controlled fusion.

Existing systems and methods employ various principles for generation of high current density ion beams. Such principles include, for example, surface ionization—cesium; (>10 mA/cm$^2$), charge exchange (μA, He, 20 keV), cold cathode (150 μA, 1-5 keV), electron impact ionization (low energy, 30 μA), hadrons (CERN accelerator), schottky, etc.

Furthermore, other known systems and methods for generating ion beams implement ion extraction mechanisms, where the ions are extracted from a plasma source. Such a plasma source may include, for example, a multicusp plasma (filaments); Ar, H2, (40 mA, f=25 mm), an electron cyclotron resonance plasma (cyclotron applications) 400 μA, (H,He,C, N,O,Ne,Ar,Kr,Xe), RF plasma; max 6 mA/cm2, Ar, O2, duoplasmatron; 20 μA, Ar, SF6, oscillation electron plasma (15 μA, 100-3000 eV), constricted dc glow discharge, laser (5 mA of Pb 18+) etc.

Typically, in an ion extraction system using a plasma source, when an electrode is biased, a plasma sheath (space charge) is formed surrounding the electrode. The plasma sheath, which is a potential structure of space charge, determines to a great extent, the direction of the ion beam extracted from the plasma source. If the sheath is parallel with the extraction electrode, then the ions are extracted perpendicular to this surface and the current density is given by the plasma parameters (plasma density (ne) and electron temperature (Te)). If the sheath has a curvature different from zero, the potential structure within the sheath affects the ion trajectories resulting in focusing or defocusing of the ion beam. Also, an increase in bias (extraction voltage applied at the electrode) has an effect on the plasma sheath and consequently on the ion beam energy and also on the directionality of the ion if the applied bias affect the sheath curvature in the vicinity of the extraction area. The aforementioned factors thus provide some play factors that can be minimized or enhanced with respect to the desired application.

Existing systems and methods describe extraction of high current density ion beam using plasma source. In one embodiment the system employs a hot filament electron bombardment ion generator as the plasma source. A plasma sheath is generated and a conductor-insulator configuration is employed for extraction of ion beam of high current density from the plasma sheath. The system includes an ion source aperture of a small size defined by a focus electrode for minimizing the effect of large extraction voltages on the plasma sheath formed. However, the system is complex to implement and has a plurality of adjustable variables for a given current density of the ion beam.

In practice, any electrode has a finite dimension that inevitably causes a so-called "edge effect" equivalent with a curvature of the sheath structure and correspondingly of the potential distribution within that part of the sheath. Such curved potential can affect the ion trajectories and it is either avoided or used when dealing with ion extraction mechanisms. A conductor-insulator interface is a direct way to produce an edge effect that can influence the directionality of an ion beam. Such alternative—or others including additional biased electrodes that can affect the potential profile within the sheath in the proximity of the extraction orifice and consequently focus or defocus the ions—was used in several applications such as e.g. U.S. Pat. No. 5,825,035 and UK981297. However, neither U.S. Pat. No. 5,825,035 nor UK981297 takes into consideration the exact distribution of the ion current over the surface of the biased electrode interfacing an insulator, the ion current distribution being not only non-uniform over the surface, but being also of a discrete nature, which includes well distinct parts on the electrode that are, for example, not reached by ions or reached with at very high current density resulted by ion focusing.

The subject matter claimed herein is not limited to embodiments that solve any disadvantages or that operate only in environments such as those described above. Rather, this background is provided only to illustrate one exemplary technology area where some embodiments described herein may be practiced.

OBJECT AND SUMMARY OF THE INVENTION

Embodiments of the invention relate to extraction of positive or negative ion beam using discrete ion focusing effect. Embodiments of the invention may apply to technology areas where ion extraction mechanisms capable of extracting an ion beam with high current density and large area are desirable.

An apparatus and method are disclosed for ion beam extraction. In an implementation, the apparatus includes a plasma source and an ion extractor. The plasma source is adapted to generate ions and the ion extractor is immersed in the plasma source to extract a fraction of the generated ions. The ion extractor is surrounded by a space charge formed at least in part by the extracted ions. The ion extractor includes a biased electrode forming an interface with an insulator. The interface is customized to form a strongly curved potential distribution in the space charge surrounding the ion extractor. The strongly curved potential distribution focuses the extracted ions towards an opening on a surface of the biased electrode. The focusing results in an ion beam.

Additional features of the invention will be set forth in the description that follows, and will in part be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more detailed description of the invention will be rendered by reference to specific embodiments thereof, which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 4 illustrates the modal and discrete focusing process.

FIG. 6 illustrates an implementation using a rectangular insulator-electrode configuration.

DETAILED DESCRIPTION OF THE PREFERRED EMBODIMENTS

Figure 1:
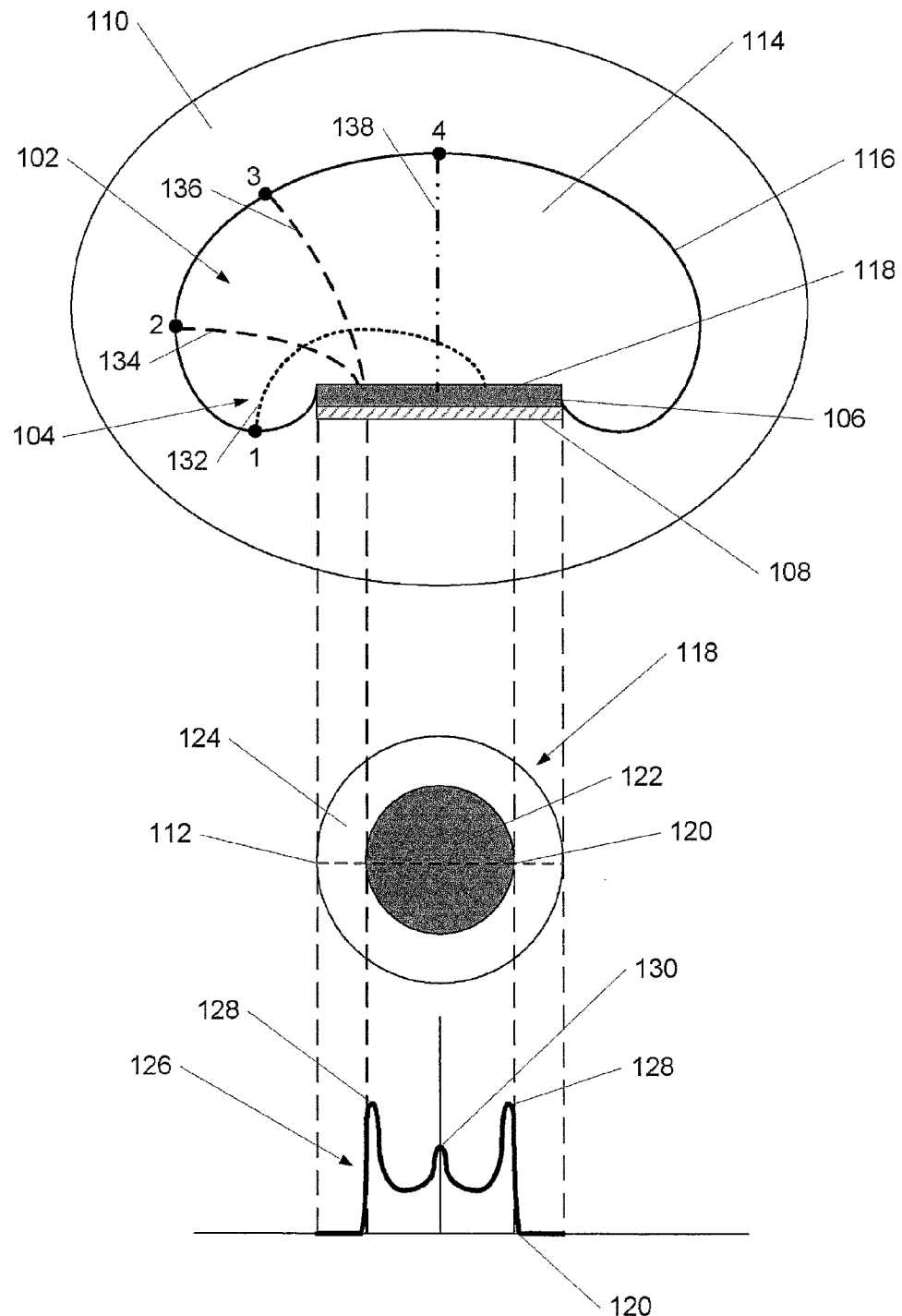
FIG. 1 illustrates the modal and discrete focusing process.

Typically, in the field of material engineering and science where ion beams are used for treatment of a target, ion extraction systems are employed. Existing ion extraction systems include an ion source for generation of ion beams (formed by positive or negative ions). Ion beams (positive or negative) are generated by extracting ions from the ion source. Thereafter, the extracted ion beam is directed towards the target under treatment. In particular, in an ion extraction system using a plasma source, when an electrode is biased and immersed in plasma, the electrode gets surrounded by a plasma sheath (space charge).

The plasma sheath, which is a potential structure of space charge, determines to a great extent, the direction of the ion beam extracted from the plasma source. Such ion extraction systems, when used in material engineering/science processes such as implantation, sputtering, etching, oxidation, ashing, deposition, etc. involve extensive and complex plasma processing techniques. For instance, most technologies using plasma source are based on ion interactions with surface of the target, and hence complex experiments may be required to evaluate such interactions. The interactions, for instance, are obtained as the surface reaction coefficients. Such evaluation of interactions contributes to the complexity of experiments since it typically involves acquiring accurate information about the physical and chemical properties of the surface and plasma source. Accordingly, the level of complexities of the experiments increases, and consequently the complexities involved in processing the plasma also increase.

Further, the mechanism by which an ion beam is extracted and focused towards a target plays a vital role on the current density of the extracted ion beam. More particularly, current density of an ion beam finds more significance in certain applications, where a high current density is desired. As such, based on the requirement of current density of the ion beam, high external potential (also referred as extraction voltage) may be applied to an electrode that extracts the ions from the plasma source electrode. As a result of such a high potential, charge density distribution of the plasma, ion trajectories, energy of the ion trajectories and incidence angle on the surface of the target may undergo variations. Such variations associated with plasma-surface technologies increase the complexity of the mechanism. In addition, ion extractions systems involve subjecting an ion beam to modifications that include one or more of: deceleration, acceleration, focusing, and deviation to achieve a desired variation in characteristics of the target. Due to such modifications, the current density associated with the ion beam may decrease.

It has been established that discrete focusing of ions is advantageous in obtaining a wide range of ion energies at high current densities apart from retaining the initial plasma environment generated by a plasma source. This also implies that further processing of the initial plasma environment may be eliminated. Thus, complexities are minimized and ion beams of high current density are obtained.

In principle, a conductor-insulator interface immersed in a plasma source results in formation of a three dimensional potential structure or a region of space-charge (sheath) upon application of appropriate bias voltage to the conductor (or an electrode). With specific designing of the conductor-insulator interface, the space-charge can be made to act as an electrostatic lens. The conductor-insulator interface generates a strongly curved potential distribution in the sheath. The curved potential distribution can be so customized to focus a flux of ions incident on an equipotential surface to a definite location (ion impact location) on the surface of the conductor. Also, the location of ion impact is dependent on plasma parameters (e.g. plasma density, electron temperature), applied bias voltage and the conductor-interface design.

The disclosed apparatus and methods can be implemented for extraction of ion beams from a plasma source using discrete ion focusing. 'Discrete ion focusing', in the ongoing context, refers to the ion flux on the surface of a biased electrode interfacing an insulator both the electrode and the insulator are immersed in plasma. Thus, the potential structure surrounding the electrode and the insulator affects the ion trajectories resulting in the formation of a passive surface (no ion impact) on the biased electrode where the passive surface is formed adjacent to the insulator and a region of high current density (focalization region) adjacent to the passive surface (830 in FIG. 8). Both the passive surface and the focalization region appear on the surface of the biased electrode. In an implementation, the apparatus includes an ion source for generating ions and an ion extractor to extract the generated ions. The ion extractor includes a biased conductor-insulator interface for extracting the generated ions by discrete ion focusing. It is noted that "conductor" and "electrode" have been interchangeably used.

In an exemplary implementation, the method includes generating a space charge of ions in a plasma source around a biased electrode interfaced with an insulator immersed in the plasma source. The method further includes forming a curved potential distribution on the space charge. The curved potential distribution results in focusing of some of the generated ions towards an opening on a surface of the biased electrode. The focusing of the ions results in an ion beam. In contrast to known systems, the disclosed apparatus and method are less complex and enable extraction of an ion beam (positive or negative) having a high current density.

Exemplary Apparatus

Despite of these known possibilities for influencing the ion trajectories, it was only very recently shown that the ion kinetics in a potential structure formed by a conductor-insulator are more complex and exhibit two interesting focusing effects, namely the discrete ion focusing effect and the modal focusing effect.

FIG. 1 illustrates the discrete focusing effect 102 along with the modal focusing effect 104. The figure displays a disc electrode 106 with a diameter significantly larger than its thickness, the disc 106 having one side conductive and the other one insulated (covered for example with an insulating material 108). When the disc 106 is placed in a plasma 110 characterized by a Debye length, which is much shorter than the disc diameter 112 and by being biased, for example, negatively with respect to plasma potential, Vpl, then a sheath 114 with a shape delimited by a sheath-edge 116 contour is formed. Upon calculating the ion trajectories from the sheath-edge 116 until reaching the electrode surface 118, one can obtain the current density as a function of the electrode radius.

The trajectories of four ions 132, 134, 136, 138 (ions 1, 2, 3, and 4, respectively) entering the sheath 114 from different locations are shown with dashed lines. The ion 1 is following a trajectory 132 that shows a change of almost 180 degrees in the direction of its velocity. Ion 1 reaches the electrode 106 close to its center despite of the fact that it enters the sheath 114 very close to the edge of the electrode 106. Despite a large distance between the entrances coordinates at the sheath-edge ions 2 and 3, these ions are directed to very close locations on the electrode surface 118. The trajectory 138 of ion 4 entering the sheath side facing the front of the electrode 106 is only slightly affected by the edge-effect.

By monitoring the impact locations of all ions on the electrode surface 118, one can notice that they are concentrated on a circular area with radius $r_{imp}$, where this circular area is smaller than the area defined by the disc diameter 112. This area is defined as the active surface 122. Consequently, the remained area of the electrode, delineated by $r_{imp}$ 120 and the edge of the electrode is not reached by ions and is thus defined as the passive surface 124.

The current density 126 as a function of radius shows a zero current density over the passive surface 124 followed by a sharp peak 128 localized at $r_{imp}$ 120 and then a decrease and one more peak at the center 130. The peak at $r_{imp}$ 120 is the result of ions entering the sheath between the location of ions 2 and 3. These ions have been focused to a very small area on the electrode surface 118. Because the zero current over the passive surface 124 is followed by a sharp increasing at $r_{imp}$ 120, this phenomenology is defined as the discrete focusing effect t102.

The peak at the center 130 results from ions entering the sheath 110 in the proximity of electrode edge. Because this focusing is more complex, exhibiting a set of modal lines for electrodes with sharp corners, and also because it can be inhibited for appropriate designs of the conductor-insulator interface, it is defined as the modal focusing effect 104.

Figure 2:
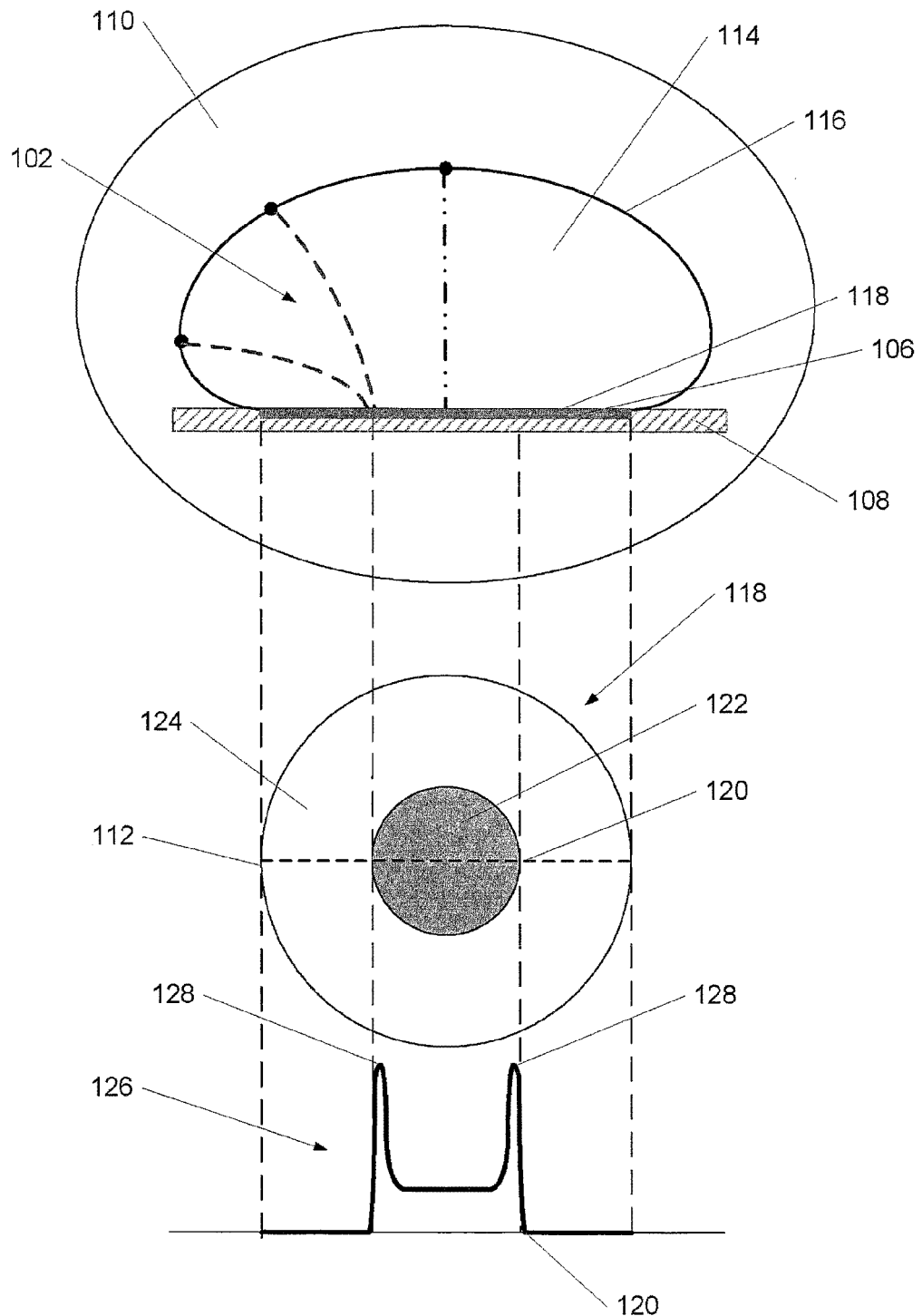
FIG. 2 illustrates the discrete focusing process.

FIG. 2 shows a conductor-insulator interface that forms only discrete focusing 102. Thus, by surrounding the disc electrode 106 with an insulator 108, the sheath 114 cannot extend below the electrode plane from where the ions forming the modal focusing 104 are collected. Consequently, the current density 126 for these configurations shows only the peaks 128 corresponding to discrete focusing 102.

Figure 3A:
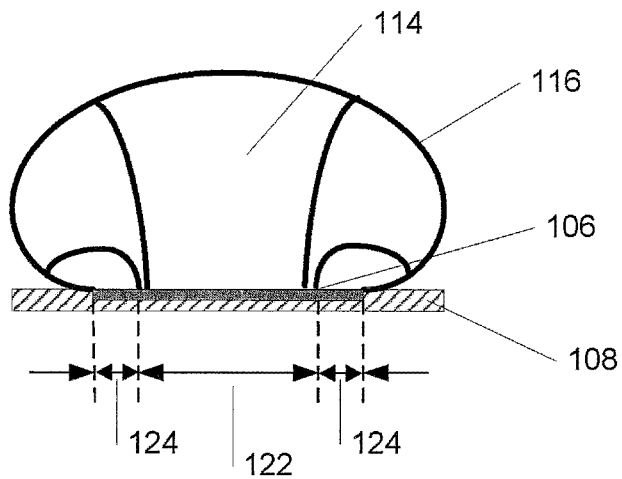
FIG. 3 illustrates the modal and discrete focusing process.
Figure 3B:
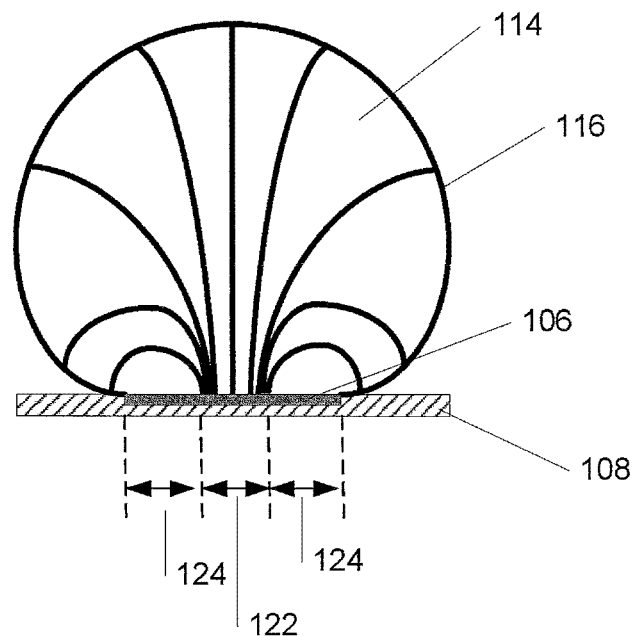
Figure 5A:
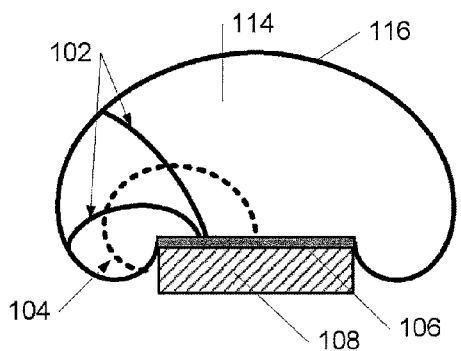
FIG. 5 illustrates different plasma-sheath-lens structures able to develop discrete focusing.
Figure 5B:
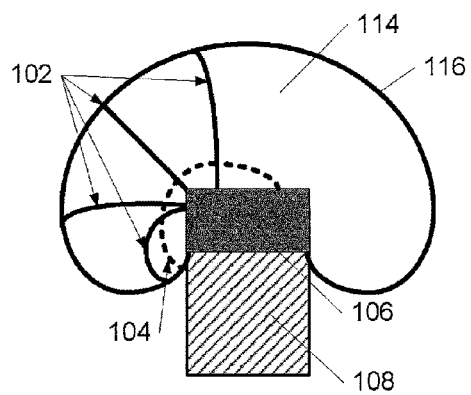
Figure 5C:
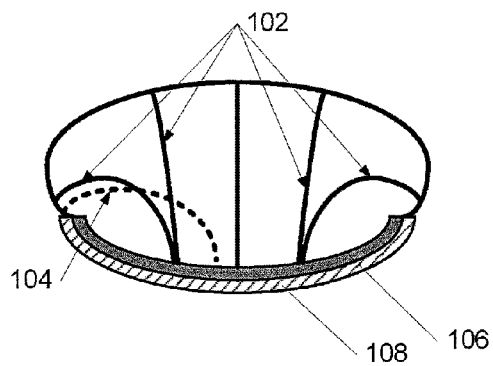
Figure 5D:
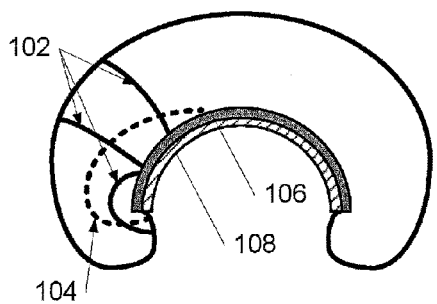
Figure 5E:
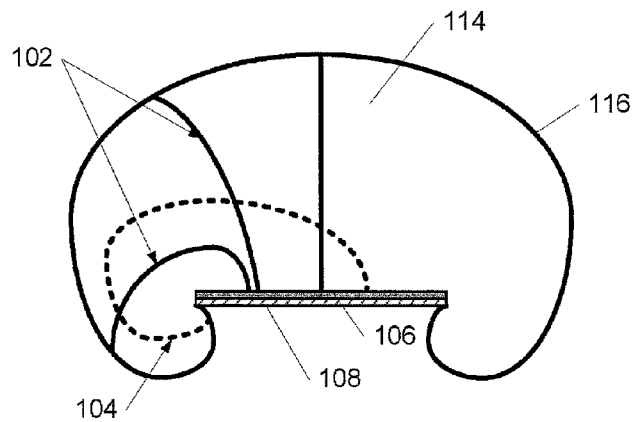

FIGS. 3a and 3b show a conductor-insulator interface similar with that of FIG. 2 where the possibility of controlling the impact location of ions focused by discrete focusing 102 by changing the plasma parameters and/or the applied bias is emphasized.

For electrodes 106 with different shapes also including sharp corners, the modal 104 and discrete 102 focusing gives more complex patterns for ion impact locations on the electrode surface 118. Such an example is shown for square electrodes 106 in FIGS. 4a-d where the current density 126 is visualized as the etching pattern (FIGS. 4c and d) on an electrode 106 made by 1×1 cm$^2$ of silicon. The discrete focusing 102 is formed for both structures, while the modal focusing 104 is present only for a sheath 114 that can collect ions from below the electrode surface. The exact shape and location on the surface for modal 104 and discrete 102 focusing effect can be predicted by three-dimensional simulations of the sheath structure followed by computation of ion trajectories.

In the above described figures, it was shown that discrete 102 and modal 104 focusing effects are more complex than just an ion trajectory 132, 134, 136, 138 deflection by a potential distribution with curved equipotential lines. If a plasma sheath lens is defined as a three-dimensional structure exhibiting the discrete 102 and modal 104 focusing effects, then appropriate plasma sheath lens structures that can focus ions to attain a desired function can be designed. Several examples of cross sections through plasma sheath lens structures are shown in FIGS. 5a-e including convex (FIG. 5c) or concave (FIG. 5d) conductor-insulator interfaces.

FIG. 6 describes an implementation using a rectangular insulator-electrode configuration that can be used to extract a longitudinal focused ion beam. The aspect ratio between the length 602 and the width 604 of the insulator 108 and electrode 106 is chosen so as to obtain a rather uniform ion flux over the active surface 122. The extraction zone 606 can be a mesh, a slit or a set of slits. The plasma 110 parameters and the applied bias on the electrode 106 must be adjusted such that the discrete focusing 102 is localized inside of the extraction region 606. Depending on plasma density, the length of the extraction zone 606 can be from a few millimeters up to several meters. Applications below 1 mm are also possible as long as the Debye length is adjusted by plasma parameters to be short enough (about ten times less than the sheath thickness). Different three-dimensional implementations are also possible for instance by bending or even closing the planar conductor-insulator structure shown in FIG. 6 as to be the lateral surface of a cylinder or a trapeze. Additional concavity or convexity can also be implemented.

Figure 7:
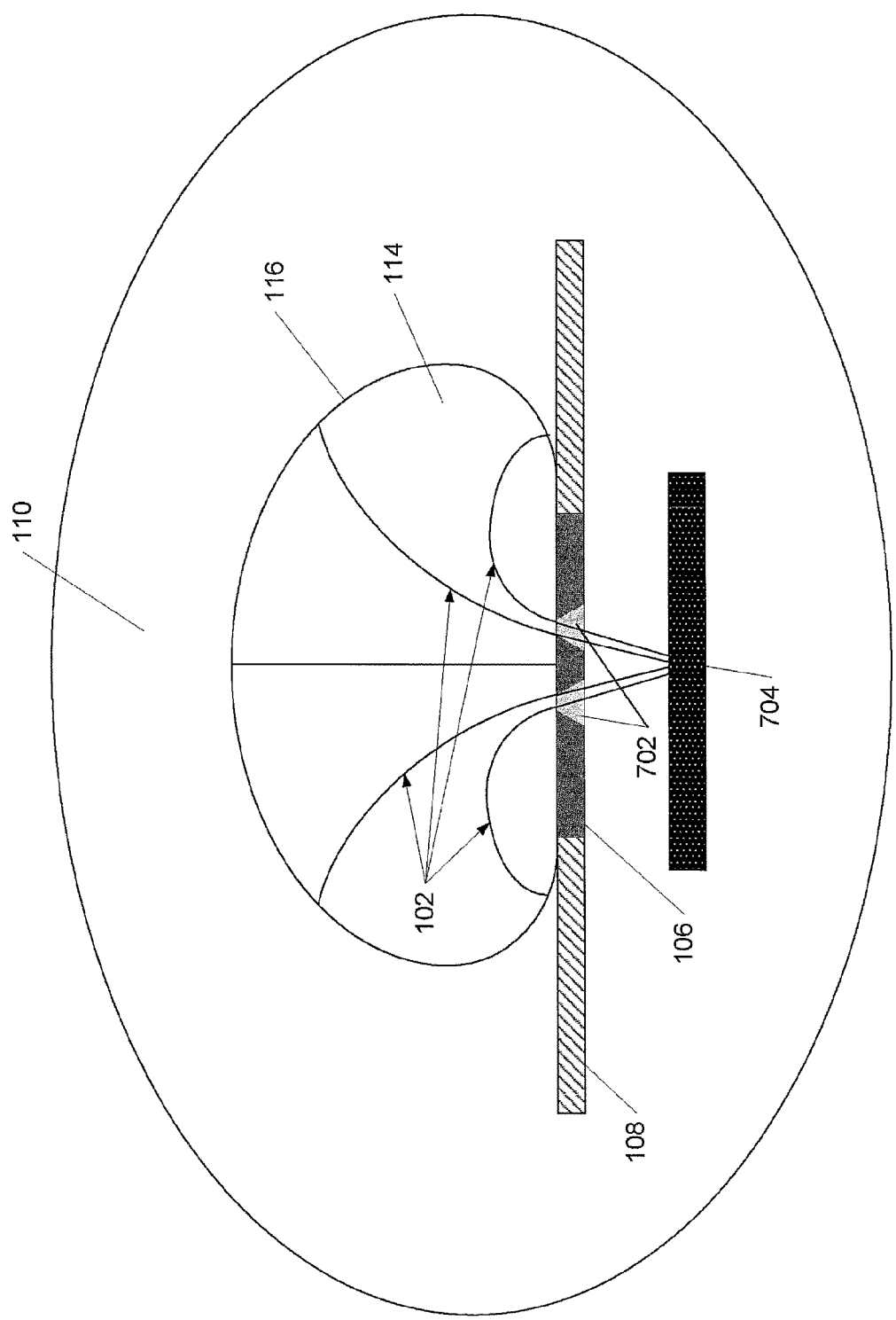
FIG. 7 illustrates an implementation using a slit for ion beam extraction.

FIG. 7 illustrates the implementation using a slit 702 for ion beam extraction. The slit is circular for a disc electrode 106. For complex implementations the location and the dimension of the slit must be calculated as to match the location of discrete ion focusing 102. The slit widths are chosen so as not to distort the plasma-sheath-lens structure.

Figure 8:
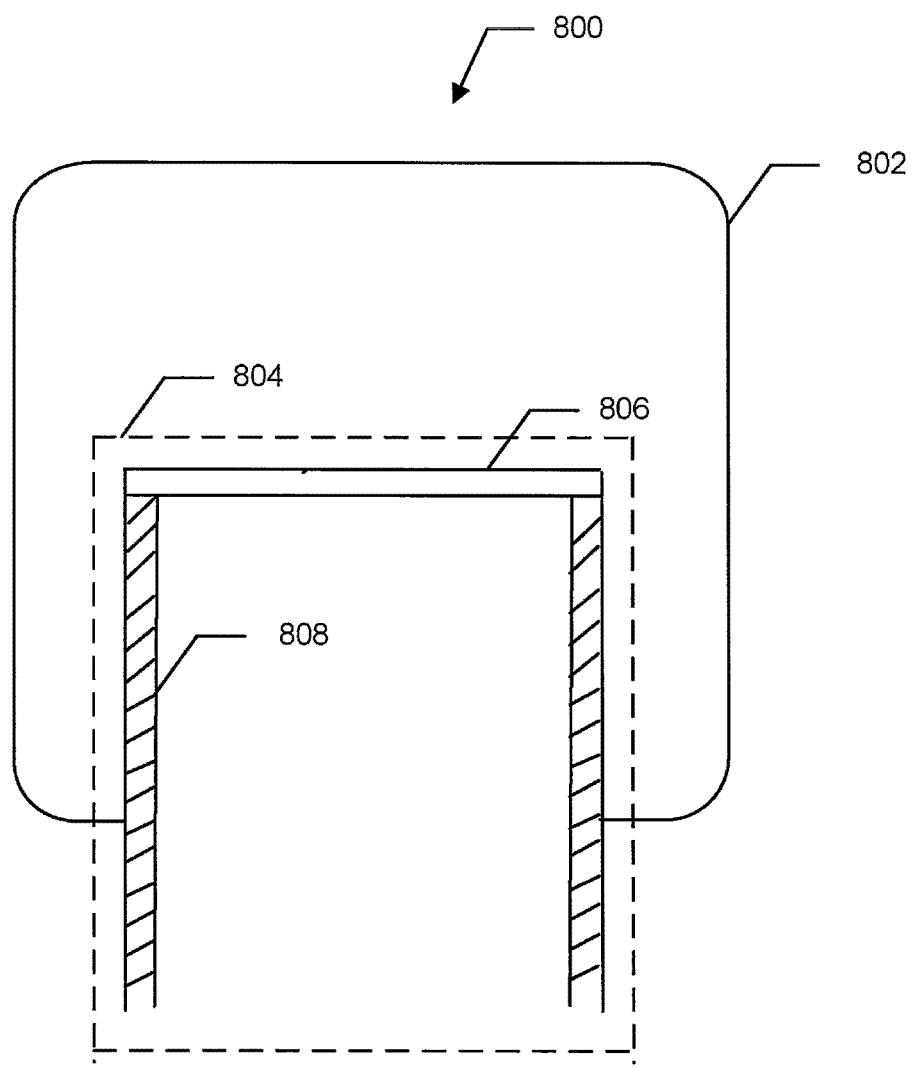
FIG. 8 schematically illustrates an example apparatus for ion beam extraction according to one embodiment.

Referring now to FIG. 8, one exemplary embodiment of an apparatus 800 for ion beam extraction according to the invention is shown. Accordingly, the apparatus 800 includes a plasma 802 generated by a plasma source (not shown in the figure). Such a plasma source may include, for example, a multicusp plasma (filaments); Ar, H2, (40 mA, f=25 mm), an electron cyclotron resonance plasma (cyclotron applications) 400 µA, (H,He,C,N,O,Ne,Ar,Kr,Xe), RF plasma; max 6 mA/cm², Ar, O2, duoplasmatron; 20 µA, Ar, SF6, oscillation electron plasma (15 µA, 100-3000 eV), constricted dc glow discharge, laser (5 mA of Pb 18+), etc.

The apparatus 800 also includes an ion extractor 804 to extract ions from the plasma 802. In an implementation, the ion extractor 804 includes an electrode 806 and an insulator 808 forming an electrode-insulator interface by direct contact or a certain distance that can affect the potential distribution induced by the biased electrode. The electrode-insulator interface may be implemented in various two or three dimensional shapes. The electrode 806 may be made of any conductive or semiconducting material. It is to be appreciated that the design of the electrode-insulator interface may be based on parameters associated with a particular chosen geometry of the electrode 806 and the insulator 804 and plasma 802.

Figure 9:
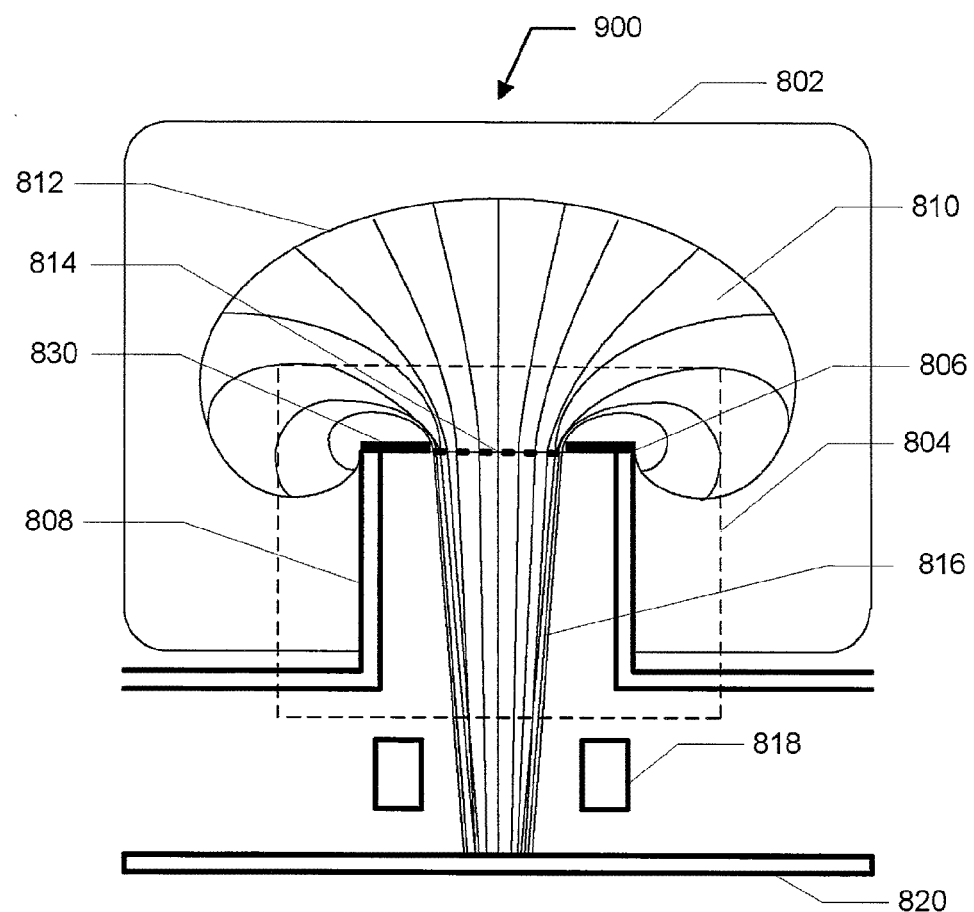
FIG. 9 schematically illustrates an example apparatus of FIG. 8 with an additional focusing electrode according to yet another embodiment.

FIG. 9 shows an apparatus 900 in accordance with another embodiment of the apparatus 800 shown in FIG. 8. It is to be appreciated that like numerals are used to identify components depicted in FIG. 8 and the associated description provided in the above paragraphs is also applicable to same components appearing in FIG. 9. The electrode 806 is biased by application of bias voltage (also referred to herein after as extraction voltage). In the following description, the term "biased electrode" and "electrode" have been interchangeably used. Depending on the polarity (positive or negative) of the bias voltage, an ion beam formed by positively charged or negatively charged ions can be extracted. For instance, the electrode 806 may be biased by applying a negative bias voltage, and positively charged ions constitute the ion beam.

As shown in FIG. 9 discussed above, the ion extractor 804, when immersed in plasma 802, results in a space charge 810 formed around the ion extractor 804. Plasma 802 provides for ions (positive or negative) which form a region or a three-dimensional space-charge 810 around the electrode-insulator interface. The ion extractor 804 may be implemented with appropriate design (of the electrode 806 and the insulator 808) to extract a fraction of the ions generated in the plasma 802.

In addition, the interface between the biased electrode 806 and the insulator 808 results in the formation of a curved potential distribution 812 in the space charge 810. The potential distribution 812 is strongly curved to focus some of the incident ions towards a well-defined location (referred as opening or extraction gap 814 hereinafter) on the surface of the biased electrode 806. The space-charge 810 with a strongly curved potential distribution 812 that surrounds the ion extractor 804 acts as an "electrostatic lens". As described earlier, the electrostatic lens focuses some of the ions from ion flux incident on the "electrostatic lens" to a well-defined location on a surface of the biased electrode 806. Thus, it may be noted that the electrostatic lens or the space-charge 810 formed around the ion extractor 804 exhibits discrete focusing effect that leads to the formation of the passive surface 830 of no ion impact. It may be noted here that ions incident on the electrostatic lens would converge onto a specific location due to applied bias voltage and the strong curvature of the potential distribution. The opening 814 on the surface of the electrode lets the ions out of the ion extractor thereby forming a beam.

It is to be appreciated that the design of the interface plays a vital role in forming the desired strongly curved potential distribution in the space charge. The optimal design of the electrode-insulator interface may be arrived at by investigating the ion flux distribution on the surface of the biased electrode 806 by 3-dimensional simulations of potential distribution and ion trajectories.

In an exemplary embodiment, the biased electrode corresponds to a conducting disc having a radius $r_d$ (disc radius). In such an embodiment, the opening corresponds to a circular slit concentric to said biased electrode 806. The circular slit is characterized by a radius $r_{imp}$ (referred hereinafter as impact radius $r_{imp}$.). In this implementation, the impact radius $r_{imp}$ depends on certain parameters in relation to plasma 802, such as density and electron temperature associated with the plasma 802. This aspect shall be explained in more detail with reference to the description of FIG. 10. In an alternative embodiment, the opening may correspond to a mesh.

In an implementation, the strongly curved potential distribution is formed at a lateral side of the space-charge 810. A fraction of the generated ions (incident ion flux) is focused by discrete focusing onto the surface of the biased electrode 806 to obtain an ion beam 816. The ion beam 816 thus obtained can be subjected to an additional biased electrode 818 to modify characteristics associated with the ion beam 816. The additional biased electrode 818 can be configured to modify properties of the ion beam such as velocity, and deflection angle. For example, the additional biased electrode 818 can affect the ion beam 816 by accelerating, decelerating, focalizing or deflecting the ion beam 816. In an implementation, the additional biased electrode 818 may include a focusing electrode. The ion beam 816 finally interacts with a surface of a target 820 placed at a pre-defined distance.

Figure 10:
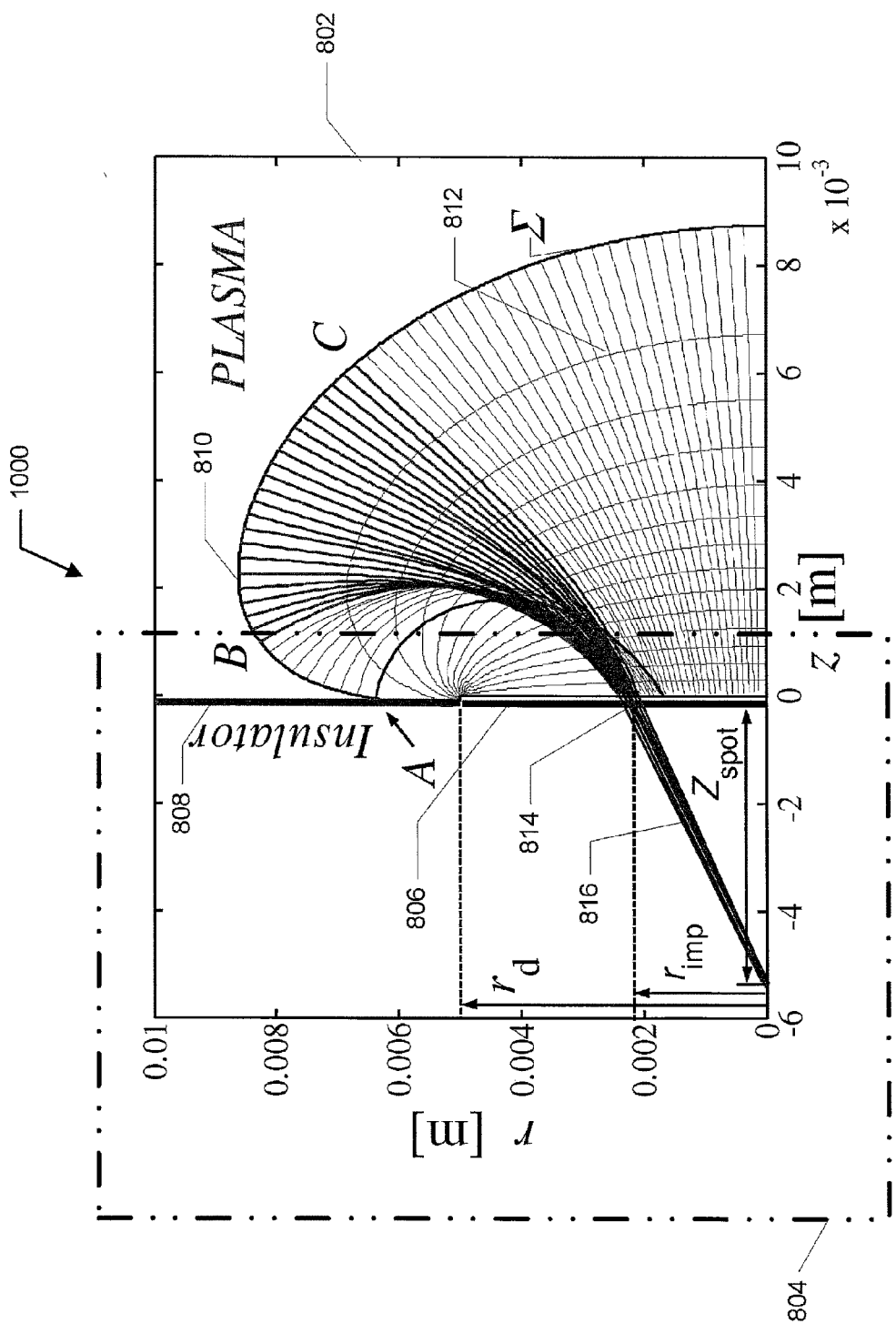
FIG. 10 illustrates a schematic representation of ion beam extraction from a plasma source using the example apparatus of FIG. 9 according to an implementation.

FIG. 10 illustrates a schematic representation 1000 for extraction of an ion beam using the apparatus 900 of FIG. 9 according to an embodiment. It may be noted that the schematic representation 1000 depicts an example implementation of the apparatus 900 obtained by simulation. Like numerals are used to identify components depicted in FIG. 8 and FIG. 9, and the associated description provided in the aforementioned paragraphs is applicable to components with like numerals in FIG. 10. In this example, a negative bias is applied to the disc-shaped electrode 806 thereby resulting in generation of positively charged ions. As discussed supra, the focusing of the ion depends on the entrance-coordinates at the space charge 810 edge (also referred as sheath-edge).

Accordingly, FIG. 10 illustrates the curved potential distribution 812 in the space charge 810 for a negatively biased disc (electrode 806) of disc radius $r_d$ that interfaces with an insulator in a xy plane. The positively charged ion trajectories entering the sheath edge Σ (110) are shown at different locations therein. For instance, as illustrated in this example, the positively charged ions entering the sheath edge from B to C are focused to the opening 814 on a surface of the biased electrode 806. As described earlier, the opening 814 may correspond to a circular slit concentric to the biased electrode 806 (disc) or a mesh covering the extraction area delineated by $r<r_{imp}$. In such cases, the opening 814 is characterized by a parameter defined as the impact radius, $r_{imp}$. The passive surface 830 corresponds to the area delineated by $r_d \geq r > r_{imp}$, and in an implementation, a gap in the electrode at $r_{imp}$ or a mesh within $r_{imp}$ is placed as an opening for ions extraction in the −z region. The extracted ions are then focused on to a target placed at a predefined distance $Z_{spot}$ from the biased electrode 806. It may be appreciated that, for a given disc radius $r_d$, the impact radius $r_{imp}$ can be controlled by adjusting the plasma parameters (plasma density and electron temperature), the bias voltage applied to the electrode 806 and the design of the biased electrode insulator interface.

Figure 11:
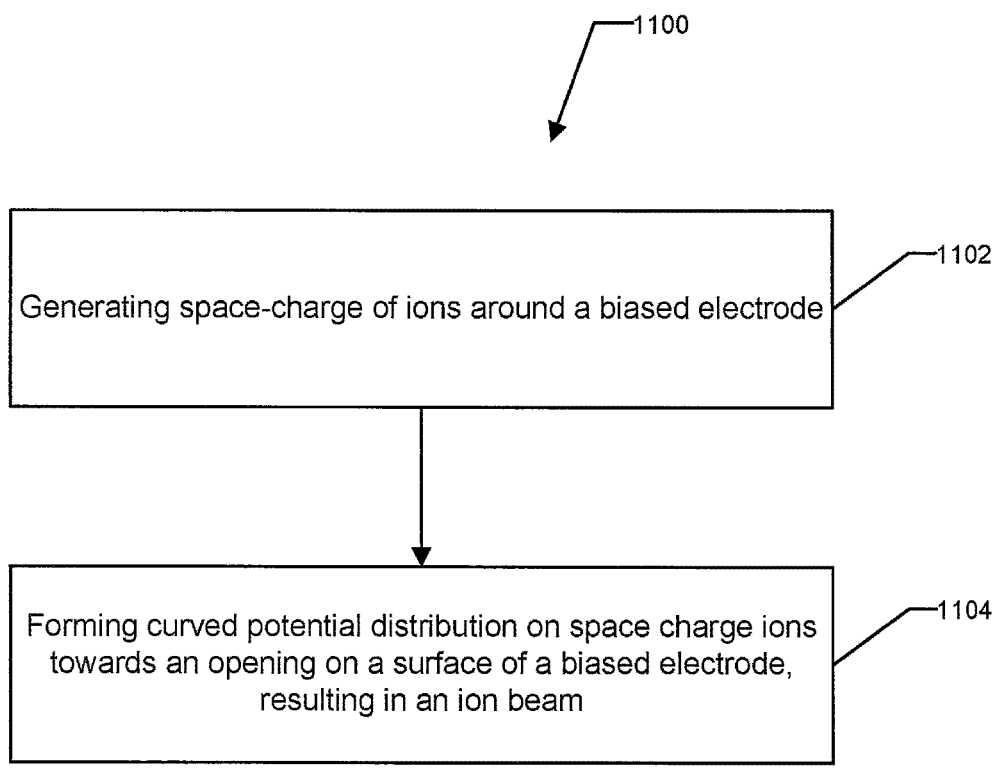
FIG. 11 shows a flow diagram of one embodiment of a method for ion beam extraction.

FIG. 11 is an exemplary flow diagram that illustrates a method for ion beam extraction. At block 1102, a space charge of ions is generated around a biased electrode. In particular, the space charge (e.g. 810) is formed when the electrode 806 interfaced with the insulator 808 is immersed in the plasma 802 (generated by a plasma source) and a bias voltage is applied to the electrode 806 (referred as biased electrode 806 hereinafter). It may be appreciated that application of a positive or a negative bias results in generation of either negatively charged or positively charged ions, respectively. Further, the biased electrode-insulator interface comprises the ion extractor 804 and extracts a fraction of the incident ions that are generated subsequent to application of bias voltage.

At 1104, a curved potential distribution is formed on the space charge. In particular, the design of the biased electrode-insulator interface is customized to form a strongly curved potential distribution 812 of ions in the space charge 810. In an implementation, the curved potential distribution 812 is formed on a lateral side of the space charge 810. Accordingly, a focusing effect by an electrostatic lens is effectuated that causes at least some of the extracted ions to be focused at definite locations (e.g. opening 814) on the surface of the biased electrode 806. Also, for a given dimension of the biased electrode 806, the location of the opening 814 (impact radius $r_{imp}$) may be determined by adjusting, for example, plasma parameters (plasma density and electron temperature), bias voltage of the biased electrode 806 and design of the interface or a combination thereof. The opening 814 may correspond to a circular slit that is concentric to the biased electrode 806 when the bias electrode 806 corresponds to a disc. In yet a further embodiment, the opening 814 may correspond to a mesh covering the area delineated by $r<r_{imp}$. Thus, the focusing results in an ion beam (e.g. 816).

In an alternative implementation, the ion beam may be subjected to modifications that include acceleration, deceleration, deflection etc. to steer the ion beam towards a target. In particular, the additional biased electrode 818 may be used to affect the ion beam (e.g. 816) by modifying one or more properties thereof. For instance, the velocity, deflection angle etc. of the ion beam 816 may be modified during its transport towards a surface of the target for carrying out appropriate modifications thereto. In this situation, the target may be situated at a predefined distance from the biased electrode 806. Accordingly, the ion beam 816 is focused onto a target placed at the predefined distance.

The present invention may be embodied in other specific forms without departing from its spirit or essential characteristics. The described embodiments are to be considered in all respects only as illustrative and not restrictive. The scope of the invention is therefore as indicated by the appended claims rather than by the foregoing description. All changes which come within the meaning and range of equivalency of the claims are to be embraced within their scope.

REFERENCES 102 discrete focusing
104 modal focusing
106 disc electrode or electrode
108 insulator or insulating material
110 plasma
112 disc diameter
114 sheath
116 sheath-edge
118 electrode surface
120 $r_{imp}$
122 active surface
124 passive surface
126 current density
128 peak in the current density at $r_{imp}$
130 peak in the current density at the center
132 trajectories of ion 1
134 trajectories of ion 2
136 trajectories of ion 3
138 trajectories of ion 4
602 length of the insulator
604 width of the insulator
606 extraction zone
702 extraction slit
704 target
800 apparatus for ion beam extraction
802 plasma
804 ion extractor
806 electrode
808 insulator
810 space charge
812 curved potential distribution
814 opening or extraction gap
816 ion beam
818 additional biased electrode
820 target surface
830 passive surface
900 apparatus for ion beam extraction
1000 schematic representation for extraction of an ion beam 1100 flow diagram
1102 generation of space charge of ions around the biased electrode
1104 formation of a curved potential distribution on the space charge

The invention claimed is:

1. An apparatus for ion beam extraction, said apparatus comprising:
a plasma source to generate a plasma containing ions; and
an ion extractor to extract a fraction of said ions from said plasma;
wherein that said ion extractor includes:
a biased electrode, an insulator, and a biased electrode-insulator interface formed there between, a first surface of said biased electrode and a first of said biased electrode-insulator interface being covered by said plasma, a design of said biased electrode and of said biased electrode-insulator interface and a bias applied to the biased electrode controlling a shape of a potential distribution between said plasma and said biased electrode-insulator interface to generate a curved potential distribution in said plasma, said curved potential distribution focusing ions passing through the curved potential distribution towards an extraction gap on the first surface of said biased electrode, the curved potential distribution surrounding the biased electrode and the insulator affecting the ion trajectories resulting in a no ion impact surface on the biased electrode adjacent to the biased electrode-insulator interface.

2. The apparatus of claim 1, wherein said plasma source comprises one of: a multicusp plasma, an electron cyclotron resonance plasma, RF plasma, duoplasmatron, oscillation electron plasma, constricted dc glow discharge, and laser.

3. The apparatus of claim 1, wherein said biased electrode is a disc-shaped conductor characterized by a disc radius ($r_d$).

4. The apparatus of claim 3, wherein said extraction gap is a circular slit concentric to said biased electrode, said circular slit being characterized by an impact radius ($r_{imp}$).

5. The apparatus of claim 4, wherein said impact radius ($r_{imp}$) depends at least in part on one or more of density and electron temperature associated with said plasma source, bias voltage of said bias electrode, and design of said biased electrode-insulator interface.

6. The apparatus of claim 1, wherein said extraction gap is a mesh.

7. The apparatus of claim 1, further comprising an additional biased electrode adapted to modify one or more properties of said ion beam.

8. The apparatus of claim 7, wherein said one or more properties comprise velocity and deflection angle of said ion beam.

9. A method for ion beam extraction, said method comprising:
generating a plasma containing ions, the plasma covering a first surface of a biased electrode and first surface of a biased electrode-insulator interface;
creating a curved potential distribution between said plasma and the biased electrode-insulator interface; and
controlling said curved potential distribution in accordance with a design of said biased electrode-insulator interface and said biased electrode, by adjusting at least one of plasma parameters and applied bias on said biased electrode to focus ions passing through the curved potential distribution towards an extraction gap on a surface of said biased electrode and to curved potential distribution surrounding the electrode and an insulator of the biased electrode-insulator interface affecting the ion trajectories resulting in a no ion impact surface on the biased electrode adjacent to the biased electrode-insulator interface.

10. The method of claim 9, further comprising: performing one or more of accelerating, decelerating, and deflecting of said ion beam to steer said ion beam towards a target.

11. The method of claim 9, wherein forming said curved potential distribution in said plasma comprises determining a location of said extraction gap for a given geometry of said biased electrode, and adjusting any one of a plasma density and electron temperature associated with generating the plasma, a bias voltage of said biased electrode, design of said interface, or a combination thereof.

12. The method of claim 11, further comprising focusing said ion beam at a predefined distance from said biased electrode.

13. An apparatus according to claim 1, wherein the biased electrode-insulator interface is a rectangular shaped interface enabling extraction of a longitudinal focused ion beam.

14. An apparatus according to claim 1, wherein the ions are negative ions.

15. An apparatus according to claim 1, wherein the shape of the curved potential distribution over the extraction gap is a concave shape.

16. An apparatus according to claim 1, wherein the curved potential distribution defines an active surface area and a no ion impact surface area of said biased electrode, and wherein the curved potential distribution is controlled to focus ions passing the curved potential distribution towards the active surface of the biased electrode, and whereas ions impacting on the no ion impact surface area is minimized.

17. An apparatus according to claim 16, wherein the curved potential distribution is controlled to maximize the no ion impact surface.

18. A method according to claim 9, wherein the curved potential distribution defines an active surface area and a no ion impact surface area of said biased electrode, the method further comprises focusing ions on the active surface area, the active surface area being a controllable fraction of a total surface area of the biased electrode where the remainder of the area is a no ion impact surface not reached by ions.

19. An apparatus for ion beam extraction, comprising:
a plasma source to generate a plasma; and
an ion extractor including an electrode having a first surface covered by the plasma;
wherein the ion extractor includes a pair of insulators defining a gap there between,
wherein the ion extractor and the plasma source control a plasma sheath shape around an extraction region of the electrode in accordance with a design of the electrode and the gap and control at least one of plasma parameters and a bias applied to the electrode, to control a plasma sheath shape around an extraction region of the electrode, and
wherein the shape of the sheath about the gap is a concave shape.

20. An apparatus for ion beam extraction, the apparatus comprising:
a plasma source; and
an ion extractor including an electrode having a first surface covered by the plasma and an insulator,
wherein the ion extractor and the plasma source control a plasma sheath shape around an extraction region of the electrode in accordance with a design of the electrode and the insulator and control at least one of plasma parameters and a bias applied to the electrode, to control a plasma sheath shape around an extraction region of the electrode;

wherein the electrode includes a semiconducting material.

21. An apparatus according to claim 20, wherein the electrode comprises an interface between the insulator and the semiconducting material.

22. An apparatus according to claim 21, wherein the insulator and the electrode define a no ion impact surface on the electrode adjacent an insulator-electrode interface.

23. An apparatus according to claim 19, wherein the pair of insulators and the electrode define a no ion impact surface on the electrode adjacent an insulator-electrode interface.

* * * * *